United States Patent [19]
McGarry et al.

[11] Patent Number: 5,939,918
[45] Date of Patent: Aug. 17, 1999

[54] ELECTRONIC PHASE SHIFTER

[75] Inventors: Steven Paul McGarry, Carp; Bruce C. Beggs, Stittsville; Rivaz Jamal, Nepean, all of Canada

[73] Assignee: Northern Telecom Limited, Montreal, Canada

[21] Appl. No.: 08/997,391

[22] Filed: Dec. 23, 1997

[51] Int. Cl.[6] .................................................. H03H 11/16
[52] U.S. Cl. .......................... 327/247; 327/246; 327/249; 327/252; 332/144; 332/146
[58] Field of Search ........................... 327/258, 237, 327/246, 247, 248, 249, 252, 253; 332/144, 146, 103, 105

[56] References Cited

U.S. PATENT DOCUMENTS

| | | | |
|---|---|---|---|
| 3,670,181 | 6/1972 | Pauly | 327/247 |
| 4,555,673 | 11/1985 | Huising et al. | 330/252 |
| 4,663,594 | 5/1987 | Perkins | 327/246 |
| 4,833,340 | 5/1989 | Deguchi | 307/262 |
| 4,837,532 | 6/1989 | Lang | 333/164 |
| 4,922,127 | 5/1990 | Denny | 327/247 |
| 5,168,250 | 12/1992 | Bingham | 333/139 |
| 5,329,546 | 7/1994 | Lee | 375/1 |
| 5,339,083 | 8/1994 | Inami | 342/157 |
| 5,408,192 | 4/1995 | Bailey | 327/254 |
| 5,451,913 | 9/1995 | Dydyk et al. | 332/103 |
| 5,532,637 | 7/1996 | Khoury et al. | 327/359 |
| 5,625,318 | 4/1997 | Sevenhans et al. | 327/563 |

OTHER PUBLICATIONS

"A 3Gb/s Bipolar Phase Shifter and AGC Amplifier" by Hans–Martin Rein et al., 1989 IEEE International Solid–State Circuits Conference, pp. 144–145.

*Primary Examiner*—Timothy P. Callahan
*Assistant Examiner*—Jung Ho Kim

[57] ABSTRACT

An electronic phase shifter splits an input signal into two signals whose amplitudes are set by a weighting circuit controlled by a phase shift control signal. Each of the two outputs of the weighting circuit is loaded with an RLC resonator, one tuned to a frequency lower than that of the input signal and one tuned to a frequency higher than that of the input signal. The loaded outputs are recombined in a vector summing network to synthesize the required phase shifted output signal. This technique permits implementation on a monolithic integrated circuit (MIC) with high gain at high frequencies (e.g. 10 GHz). It also allows a large dynamic range of operation and a large (i.e., greater than 90 degrees) controllable phase shift. This is accomplished without the use of variable reactance elements or any other components external to the MIC.

12 Claims, 5 Drawing Sheets

FROM COLLECTOR

ELECTRONIC PHASE SHIFTER

BACKGROUND OF THE INVENTION

This invention relates to a phase shifter.

Various applications in telecommunications require continuously variable phase shifters. Variable phase shifter designs typically rely on the use of delay lines of a specified electrical length, variable resistors, or variable reactance components.

It is often desirable to fabricate a phase shifter monolithically on an integrated circuit (IC). In such instance, components which can provide a reactance controlled by an applied voltage or current, such as varactor diodes and/or field effect transistors (FETs), may be used. However, some IC processes may not provide suitable components for such an application which presents a hurdle to their use in a monolithic IC (MIC) phase shifter. This is the case with many bipolar IC processes. Further, even for processes possessing the required variable reactance components, an architecture avoiding variable reactance components may be preferred.

A bipolar component phase shifter design which avoids variable reactances is disclosed in U.S. Pat. No. 4,833,340 issued May 23, 1989 to Deguchi. In Deguchi, a resistor-capacitor (RC) network splits an input signal, $e_{in}$, into two signals, $e_1$ and $e_2$, each having a predetermined amplitude and phase shift with respect to the input signal dependent upon the values of the resistors and capacitors. These two signals are then applied to a Gilbert Cell Multiplier (GCM) which comprises three differential pair amplifiers, herein referred to as differential pairs. More particularly, $e_1$ inputs a first differential pair of the GCM and $e_2$ inputs a second differential pair of the GCM. The gain of these two differential pairs is driven by a phase shift control signal input via the third differential pair of the GCM. At the output of the device, $e_1$ and an inverted version of $e_2$ are vectorially summed to obtain $e_{out}$ which has a phase shift with respect to $e_{in}$. In a complementary fashion, the gains of the first and second differential pairs can be adjusted to control the amplitude of $e_1$ and $e_2$ so that a selectable phase shift with respect to $e_{in}$ can be obtained.

There are a number of drawbacks to this design.

The frequency response varies drastically with phase control from a pure low-pass response at one extreme to a pure high-pass one at the other and at high frequencies it is strongly influenced by the input characteristics of the GCM. Further, the out-of-band gain is higher than the signal gain and very broad over most of the phase range. This can cause problems with noise, unwanted signals and harmonics, and their variation with phase control.

The subject invention seeks to provide a phase shifter which may be used with high frequency input signals and may be fabricated on a bipolar MIC.

SUMMARY OF THE INVENTION

According to the present invention, there is provided a phase shifter for an input signal, comprising: a first resonator tuned to a frequency less than that of said input signal; a second resonator tuned to a frequency higher than that of said input signal; a weighting circuit for, responsive to a control signal, applying a magnitude adjusted form of said input signal to each of said first resonator and said second resonator; a summing circuit for summing an output of said first resonator and an output of said second resonator to obtain a phase shifted output signal.

BRIEF DESCRIPTION OF THE DRAWINGS

In the figures which describe example embodiments of the invention.

DETAILED DESCRIPTION OF THE PREFERRED EMBODIMENTS

Figure 1:
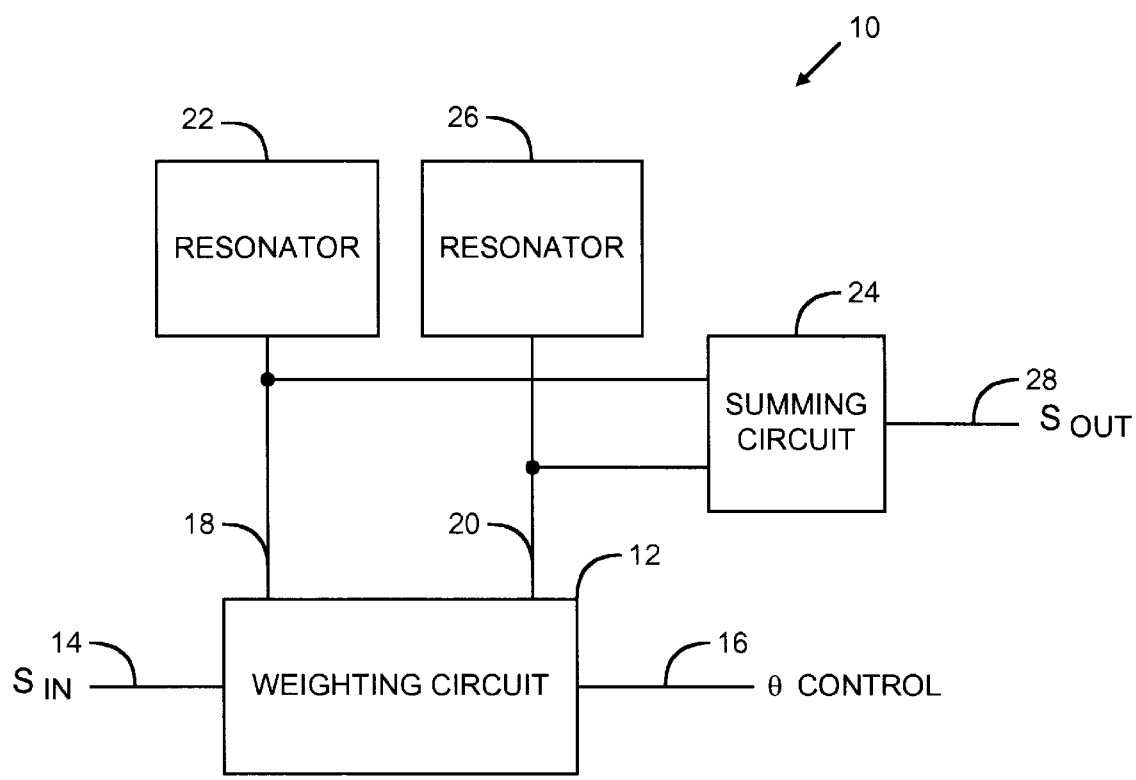
FIG. 1 is a schematic diagram of a phase shifter made in accordance with this invention.

Turning to FIG. 1, a phase shifter 10 comprises a weighting circuit 12 for receiving an input signal on line 14 and a phase control signal on line 16. The weighting circuit outputs on lines 18 and 20. Output line 18 is coupled to a first resonator 22 and to a summing circuit 24. Output line 20 is coupled to a second resonator 26 and to the summing circuit 24. The summing circuit outputs on line 28.

Figure 2:
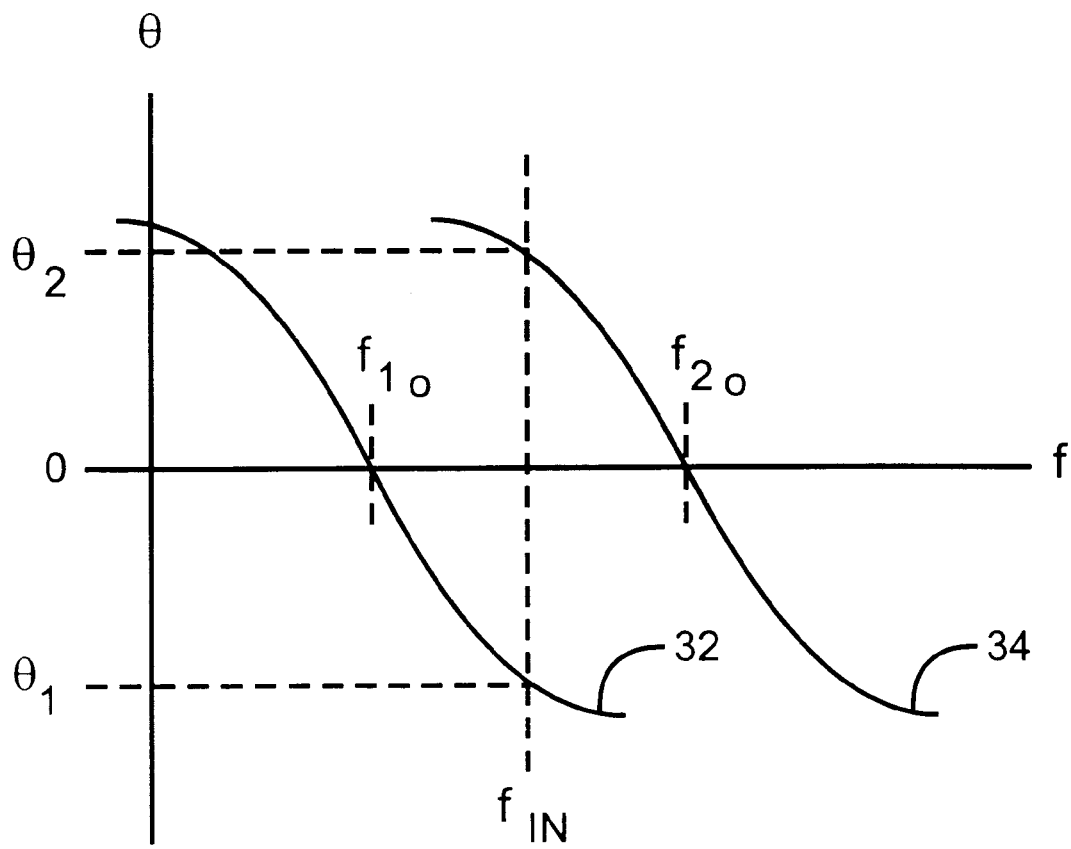
FIG. 2 is a graph illustrating an operating point of the phase shifter of FIG. 1.
Figure 3:
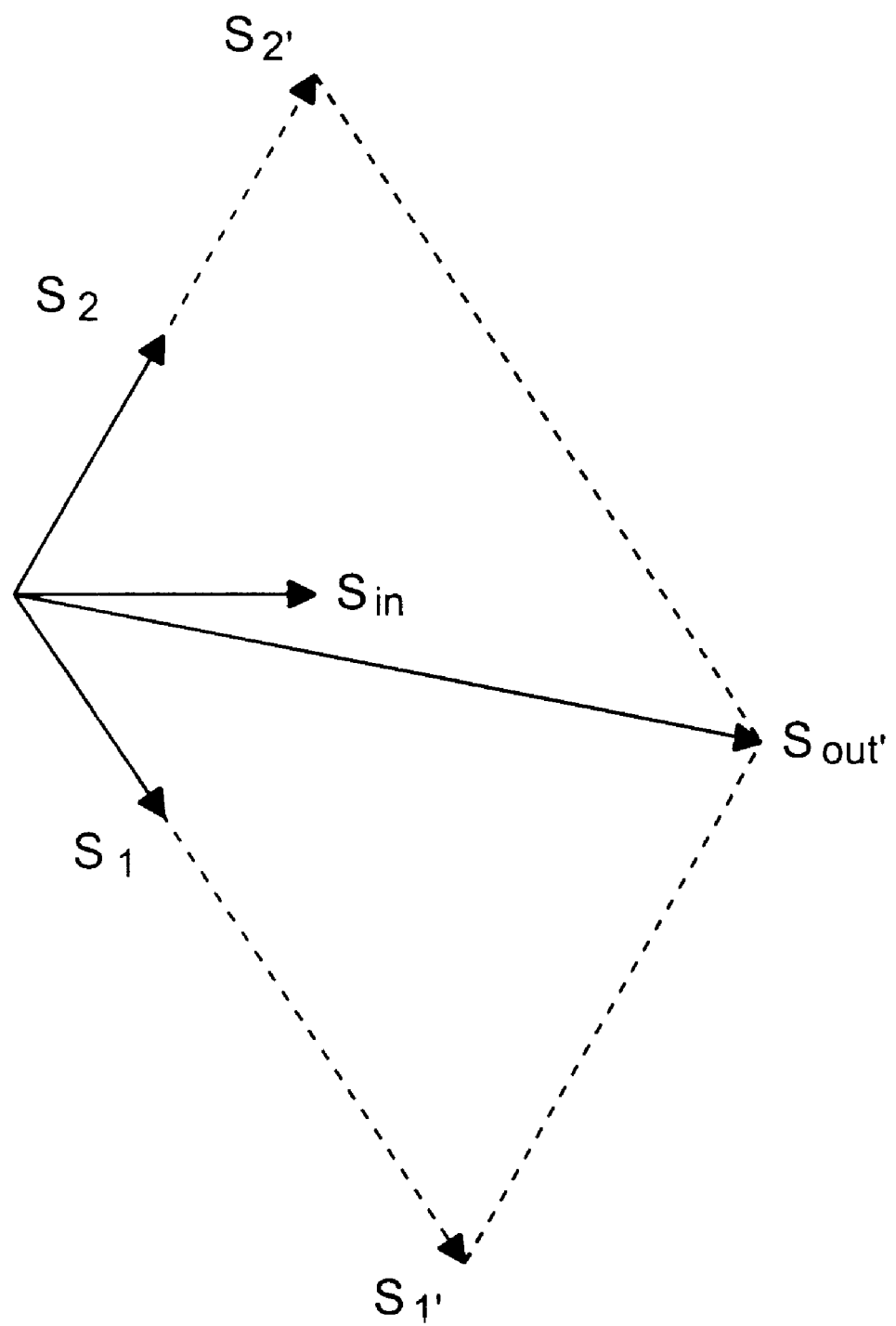
FIG. 3 is a phasor diagram illustrating operation of the phase shifter of FIG. 1, and FIGS. 4 to 6 are schematic diagrams illustrating a preferred embodiment of this invention.

The first resonator is tuned to a frequency less than that of the input signal and the second resonator is tuned to a frequency higher than that of the input signal. As will be appreciated by those skilled in the art, the phase of a signal in a resonator varies with frequency, with the phase passing through 0° at the resonant frequency. If the first and second resonators are parallel resonators, their variation of phase with frequency may be represented by FIG. 2, with curve 32 representing the frequency dependent phase of a signal in the first resonator and curve 34 the frequency dependent phase of a signal in the second resonator. As shown in FIG. 2, the resonant frequency for the first resonator is at $f_{1o}$, the resonant frequency for the second resonator is at $f_{2o}$, and the frequency of the input signal is between the two resonant frequencies, at $f_{in}$. From FIG. 2 it will readily be apparent that if the input signal is applied to the first resonator, its phase will be retarded by $\theta_1$ and if the input signal is applied to the second resonator, its phase will be advanced by $\theta_2$. FIG. 3 is a phasor diagram illustrating the same result with $s_{in}$ representing the input signal, $s_1$ the signal applied to the first resonator, and $s_2$ the signal applied to the second resonator.

In operation of the phase shifter of FIG. 1, with an input signal, $s_{in}$, arriving on line 14, responsive to a control signal arriving on line 16, the weighting circuit 12 applies a magnitude adjusted form of the input signal to each of the first resonator 22 and the second resonator 26. For example, the weighting circuit could triple the magnitude of the input signal when applying same to the first resonator and double the magnitude of the input signal when applying same to the second resonator. FIG. 3 illustrates these magnitude adjusted signals applied to the first and second resonators as $s_1'$ and $s_2'$, respectively.

The summing circuit 24 simply adds the signals applied to the resonators to obtain an output signal, $s_{out}$, which is passed to line 28. The addition of the signals in the resonators is represented by vector addition of the phasors of FIG. 3, with the signal, $s_{out}'$, resulting in the case where the magnitude adjusted signals in the first and second resonators are $s_1'$ and $s_2'$, respectively.

It will be apparent that by an appropriate choice of the magnitude of $s_1$ and $s_2$, the output signal, $s_{out}$, has a chosen phase anywhere between the phase of $s_1$ and the phase of $s_2$.

The weighting circuit could be a non-amplifying current divider or steerer controlled by a control signal. However, in such case, the magnitude adjustments would always result in signals having a smaller amplitude than the input signal under common matching conditions. In situations where the input signal level is low, it is generally preferred to magnify the input signal through the phase shifter. This may be achieved by realising the weighting circuit as a current steering amplifier in a Gilbert Cell configuration, as illustrated in FIG. 4.

Figure 4:
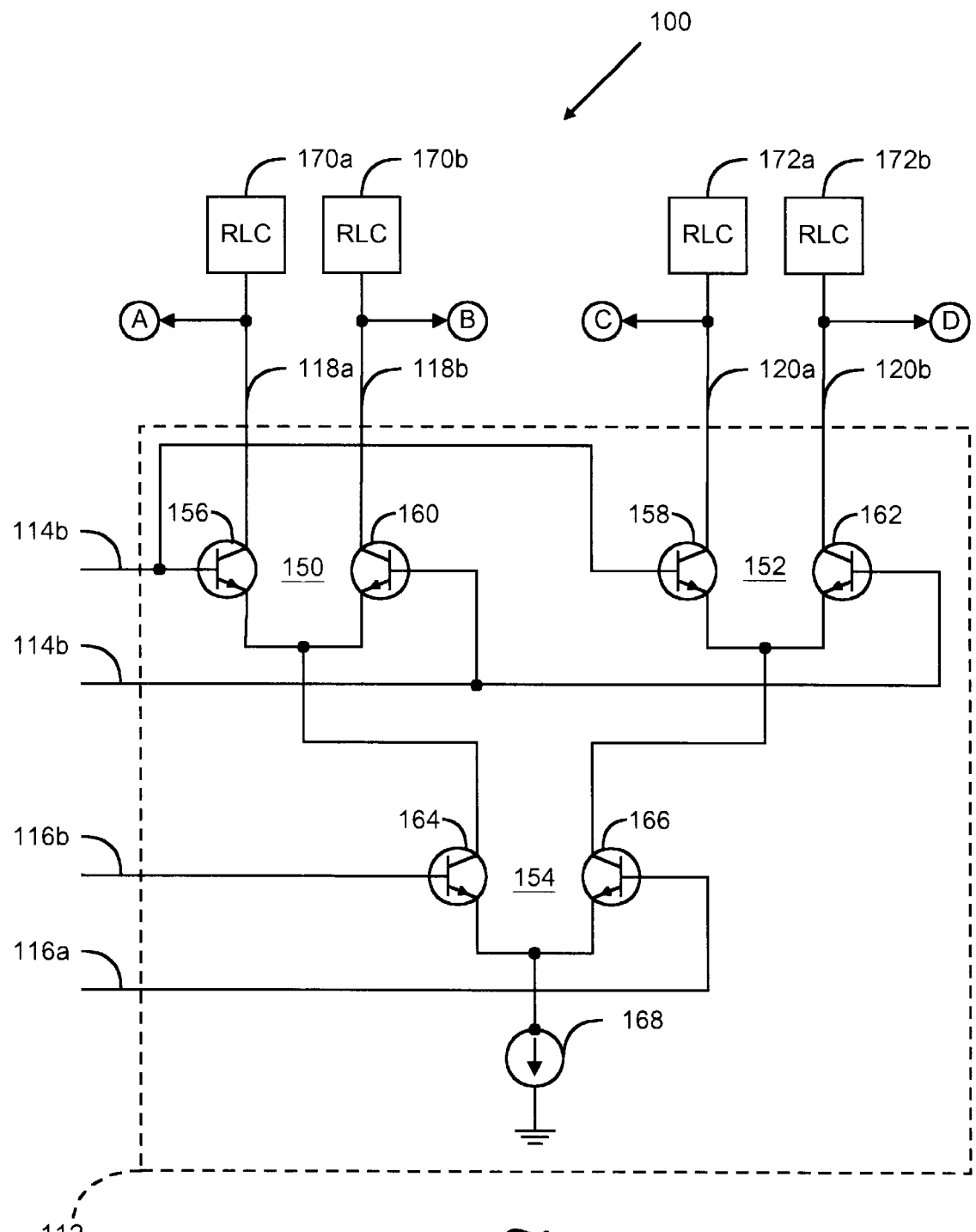

Turning to FIG. 4, the weighting circuit 112 of phase shifter 100 comprises first, second, and third bipolar differential pairs 150, 152, and 154. The base of one amplifier 156, 158 of each of the first and second differential pairs 150, 152 is connected to input line 114a and the base of the other amplifier 160, 162 of each of the first and second differential pairs is connected to input line 114b which receives an inverted version of an input signal on line 114a. The emitters of the first differential pair 150 are connected to the collector of one amplifier 164 of the third differential pair 154 and the emitters of the second differential pair 152 are connected to the collector of the other amplifier 166 of the third differential pair 154. The emitters of the third differential pair are connected to a current source 168 and the bases of the third differential pair are input by differential control signal lines 116a, 116b (i.e., for a given control signal on line 116a, an inverted version of the control signal appears on line 116b).

Figure 5:
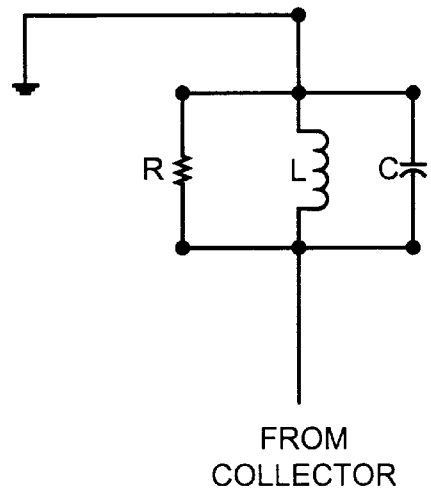
Figure 6:
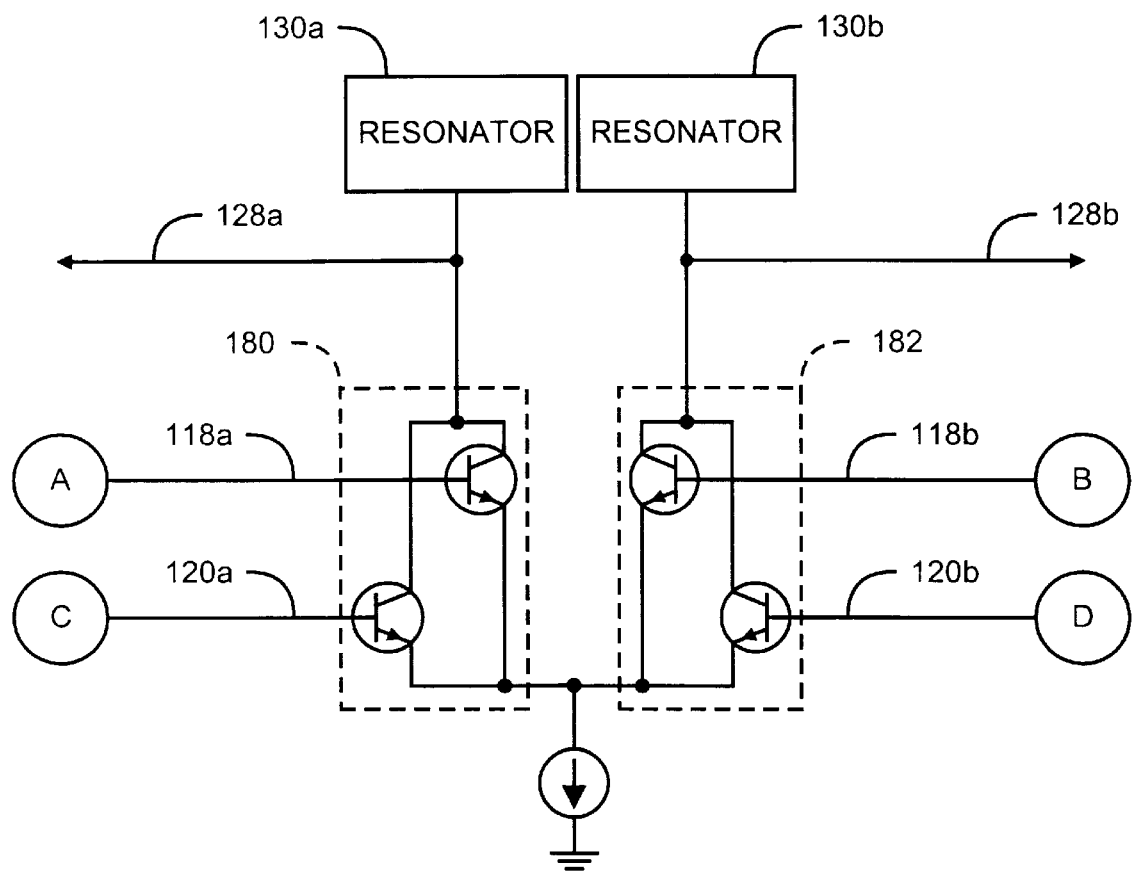

The collector of amplifier 156 is connected to an output line 118a coupled to a resistor-inductor-capacitor (RLC) circuit 170a. The collector of amplifier 160 is connected to an output line 118b which is coupled to RLC circuit 170b. The collector of amplifier 158 is connected to an output line 120a which is coupled to RLC circuit 172a and the collector of amplifier 162 is connected to an output line 120b which is coupled to RLC circuit 172b. Each RLC circuit may be arranged as a parallel circuit as illustrated in FIG. 5 or as a series circuit, or two of the circuit elements may be in series with the third in parallel. As another option, it may be possible to dispense with the resistor in the RLC circuits illustrated in FIG. 5 as even in the absence of a resistor there will generally be parasitic resistances in this circuit. RLC circuits 170a and 170b are resonators tuned to the same frequency, which frequency is below that of the frequency of a signal intended to input the phase shifter and RLC circuits 172a and 172b are resonators tuned to same frequency, which frequency is above that of the frequency of a signal intended to input the phase shifter. Output lines 118a and 120a are summed in a summing circuit as are output lines 118b and 120b. FIG. 6 illustrates an example summing circuit: output lines 118a and 120a input two transistors on one side of a differential pair 180 which outputs on line 128a and output lines 118b and 120b input two transistors on the other side of differential pair 182 which outputs on line 128b. The collectors of the two sides of the summing circuit have resonant loads 130a, 130b at the frequency of the input signal to limit out-of-band gain (which represents noise and unwanted signals and harmonics).

In operation of phase shifter 100, with a differential input signal on lines 114a, 114b to the first and second differential pairs 150, 152, a differential control signal on lines 116a, 116b of the third differential pair 154 determines the gain, in a complementary fashion, of the first and second differential pairs. The gain of the first and second differential pairs is complementary in that the third differential pair acts as a selectable current divider for the current source on its emitter. The selected gain version of the input signal for the first differential pair appears on line 118a and, in inverted form, on line 118b. Resonators 170a and 170b retard the phase of the signals on lines 118a and 118b to the same extent. Similarly, the selected gain version of the input signal for the second differential pair appears on line 120a and, in inverted form, on line 120b; resonators 172a and 172b advance the phase of the signals on lines 120a and 120b to the same extent.

By summing signals on lines 118a and 120a and on lines 118b and 120b, two phase shifted signals are available at the output of the summing circuit, one which is inverted with respect to the other (i.e., one which is 180° out of phase with respect to the other). By providing inverted signals at the output of the summing circuit, a greater range of phase shifts is available at the output. This is desirable for some applications, such as filter-based clock recovery circuits, which require a large phase shifting range.

As will be appreciated by those skilled in the art, many other arrangements are possible for the summoning circuit.

While the input lines 114a, 114b (FIG. 4) have been described as differential inputs, as an option, a (DC) signal reference may be applied to one of the input lines instead of a complementary signal. Similarly, a signal reference may be applied to one of the control lines 116a, 116b (FIG. 4) in place of a complementary signal.

The phase shifter may be fabricated with heterojunction bipolar transistors (HBTs) preferably in the gallium arsenide (GaAs) system as such transistors are capable of operating at very high frequencies. An added advantage of this system is that semi-insulating (SI) substrates are used which facilitates the production of high quality inductors. By using tuned amplifiers instead of RC networks to achieve two signals with a predetermined phase shift and amplitude prior to vector summing, the phase shifter 100 can be operated close to the frequency limits of the HBT, which is much higher than the frequency limits of an RC phase-splitting network and GCM combination fabricated by the same HBT process for the same phase range and gain.

In an exemplary embodiment, the phase shifter 100 is used in a SONET OC-192 clock recovery circuit where the clock has a nominal frequency of 10 GHz. In such case, resonators 170a, 170b may be tuned to 8.4 GHz and resonators 172a, 172b may be tuned to 11.6 GHz. The phase difference between a signal on line 118a and on line 120a will then be greater than 93° at 10 GHz.

In a modified form of the phase shifter of FIG. 4, the components may be realised as FET components rather than bipolar components. In such case, it is preferred to use high frequency devices and high Q passive components as are available in a GaAs MESFET or high electron mobility transistor (HEMT) process.

It will be apparent that phase shifter 100 is compatible with monolithic integration without using variable impedance elements such as resistors and/or capacitors. It will also be apparent that the phase shifter of this invention is controllable electronically via a control signal on line 16 (FIG. 1) or lines 116a, 116b (FIG. 4). This adapts the phase shifter for use in such applications as phase shift oscillators and phase modulators. As well, where the weighting circuit is a gain stage, as the embodiment of FIG. 4, the phase shifter is well adapted for use in implementing a phased array.

As will be appreciated by those skilled in the art, the circuits shown and described will, for practical reasons, such as for the purposes of biasing, gain stability and thermal stabilisation, include other circuit elements, which have not been shown.

Modifications will be apparent to those skilled in the art and, therefore, the invention is defined in the claims.

What is claimed is:

1. A phase shifter for an input signal, comprising:

a first resonator tuned to a frequency less than that of said input signal;

a second resonator tuned to a frequency higher than that of said input signal;

a weighting circuit for, responsive to a control signal, applying a magnitude adjusted form of said input signal to each of said first resonator and said second resonator;

a summing circuit for summing an output of said first resonator and an output of said second resonator to obtain a phase shifted output signal.

2. The phase shifter of claim 1 wherein said weighting circuit comprises a first amplifier for applying a selectable first gain to said input signal to obtain a first gain signal which is applied to said first resonator and a second amplifier for applying a selectable second gain to said input signal to obtain a second gain signal which is applied to said second resonator.

3. The phase shifter of claim 2 wherein said weighting circuit comprises a current steering amplifier input with said input signal and one of an inverted form of said input signal and a reference signal.

4. The phase shifter of claim 1 wherein said first resonator comprises a resistor-inductor-capacitor (RLC) circuit and wherein said second resonator comprises an RLC circuit.

5. The phase shifter of claim 4 wherein each amplifier of said current steering amplifier comprises one of a bipolar transistor and a FET.

6. The phase shifter of claim 5 wherein said first resonator, said second resonator, said current steering amplifier, and said summing circuit are each fabricated on a monolithic integrated circuit.

7. The phase shifter of claim 1 including:

a third resonator tuned to said frequency less than that of said input signal;

a fourth resonator tuned to said frequency higher than that of said input signal;

and wherein said weighting circuit comprises a circuit having a first differential pair, one amplifier of said first differential pair input with said input signal and outputting to said first resonator, another amplifier of said first differential pair input with one of an inverted form of said input signal and a reference signal and outputting to said third resonator;

a second differential pair, one amplifier of said second differential pair input with said input signal and outputting to said second resonator, another amplifier of said second differential pair input with one of an inverted form of said input signal and a reference signal and outputting to said fourth resonator; and a third differential pair input with said control signal and with a source of current, one amplifier of said third differential pair outputting to said first differential pair and another amplifier of said third differential pair outputting to said second differential pair.

8. The phase shifter of claim 7 wherein each of said first resonator, said second resonator, said third resonator, and said fourth resonator comprises a resistor-inductor-capacitor (RLC) circuit.

9. The phase shifter of claim 8 wherein said summing circuit comprises two differential pairs, one pair differentially input with an output of said first resonator and an output of said second resonator and another pair differentially input with an output of said third resonator and an output of said fourth resonator, said summing circuit having a summing output and an inverted summing output.

10. The phase shifter of claim 9 wherein said summing circuit comprises a resonator loading each of said two differential pairs, each said resonator resonating proximate a center frequency of said input signal.

11. A phase shifter for an input signal, comprising:

a first resonator tuned to a frequency less than that of said input signal;

a second resonator tuned to a frequency higher than that of said input signal;

a weighting circuit for, responsive to a control signal, weighting said input signal with a first weighting and applying said input signal weighted by said first weighting to a first output loaded with said first resonator and weighting said input signal with a second weighting and applying said input signal weighted by said second weighting to a second output loaded by said second resonator;

a summing circuit for summing said first output and said second output to obtain a phase shifted output signal.

12. A phase shifter for a high frequency input signal, comprising:

a steering amplifier circuit for inputting with said high frequency input signal and with a phase shifting control signal;

a first resonating circuit for resonating at a frequency less than that of said high frequency signal, said first resonating circuit loading a first output of said steering amplifier;

a second resonating circuit for resonating at a frequency greater than that of said high frequency signal, said second resonating circuit loading a second output of said steering amplifier;

a combining circuit coupled to said first steering amplifier output and said second steering amplifier output.

* * * * *

UNITED STATES PATENT AND TRADEMARK OFFICE
CERTIFICATE OF CORRECTION

PATENT NO. : 5,939,918

DATED : August 17, 1999

INVENTOR(S) : Steven Paul MCGARRY, Bruce C. BEGGS, Riyaz JAMAL

It is certified that error appears in the above-identified patent and that said Letters Patent is hereby corrected as shown below:

On the title page, item [75]
Inventors: replace "Rivaz Jamal" with --Riyaz Jamal--

Signed and Sealed this

Fourteenth Day of March, 2000

Attest:

Q. TODD DICKINSON

Attesting Officer

Commissioner of Patents and Trademarks